(12) United States Patent
Tan

(10) Patent No.: US 7,848,720 B2
(45) Date of Patent: Dec. 7, 2010

(54) METHOD AND APPARATUS FOR AUTO-TUNING OF A RADIO FM-RECEIVER

(75) Inventor: Han Leng Paxton Tan, Singapore (SG)

(73) Assignee: NXP B.V., Eindhoven (NL)

( * ) Notice: Subject to any disclaimer, the term of this patent is extended or adjusted under 35 U.S.C. 154(b) by 175 days.

(21) Appl. No.: 10/516,546

(22) PCT Filed: Jun. 4, 2003

(86) PCT No.: PCT/IB03/02427

§ 371 (c)(1),
(2), (4) Date: Dec. 2, 2004

(87) PCT Pub. No.: WO03/105342

PCT Pub. Date: Dec. 18, 2003

(65) Prior Publication Data

US 2005/0227648 A1    Oct. 13, 2005

(30) Foreign Application Priority Data

Jun. 7, 2002    (SE)    .................................... 0200116

(51) Int. Cl.
*H04B 1/18*    (2006.01)
(52) U.S. Cl. ............... 455/185.1; 455/179.1; 455/161.3
(58) Field of Classification Search ... 455/161.1–169.2, 455/179.1–187.1
See application file for complete search history.

(56) References Cited

U.S. PATENT DOCUMENTS

| | | | | |
|---|---|---|---|---|
| 4,439,787 A * | 3/1984 | Mogi et al. | ................. | 348/735 |
| 4,509,203 A * | 4/1985 | Yamada | ................... | 455/166.2 |
| 4,833,728 A * | 5/1989 | Kimura et al. | ........... | 455/166.2 |
| 4,839,628 A * | 6/1989 | Davis et al. | ................ | 340/7.41 |
| 4,856,082 A * | 8/1989 | Kasa | ........................ | 455/161.2 |
| 4,903,328 A * | 2/1990 | Ichikawa | .................. | 455/165.1 |
| 5,125,105 A * | 6/1992 | Kennedy et al. | ......... | 455/164.1 |
| 5,262,769 A * | 11/1993 | Holmes | ..................... | 340/7.42 |
| 5,371,550 A * | 12/1994 | Shibutani et al. | ........... | 348/570 |
| 5,650,830 A * | 7/1997 | Lee | ............................. | 348/731 |
| 5,749,048 A * | 5/1998 | Masuda | ................... | 455/186.1 |
| 5,842,119 A * | 11/1998 | Emerson et al. | .......... | 455/161.3 |
| 5,867,766 A * | 2/1999 | Dinc et al. | .................... | 455/62 |
| 5,870,666 A * | 2/1999 | Tanaka et al. | ............ | 455/67.11 |
| 5,937,338 A * | 8/1999 | Tomita | ..................... | 455/161.2 |
| 5,940,748 A * | 8/1999 | Daughtry et al. | ......... | 455/182.2 |

(Continued)

FOREIGN PATENT DOCUMENTS

EP    0430469 A2    6/1991

(Continued)

*Primary Examiner*—Edward Urban
*Assistant Examiner*—RuiMeng Hu

(57) ABSTRACT

In a method of auto-tuning a radio FM-receiver the receiver frequency band is scanned until a FM signal is received meeting criteria for identifying the signal as being of a predetermined quality, particularly coming from a valid FM station. At least during tuning it is permanently established whether or nor the FM signal meets the criteria, whereafter the results thereof are read a predetermined number of times, and the FM signal is only stored if at least most of these times the criteria are met. Particularly, the results are read 10 times and the FM signal is only stored if at least 8 times thereof the criteria are met.

6 Claims, 1 Drawing Sheet

U.S. PATENT DOCUMENTS

Figure 1:
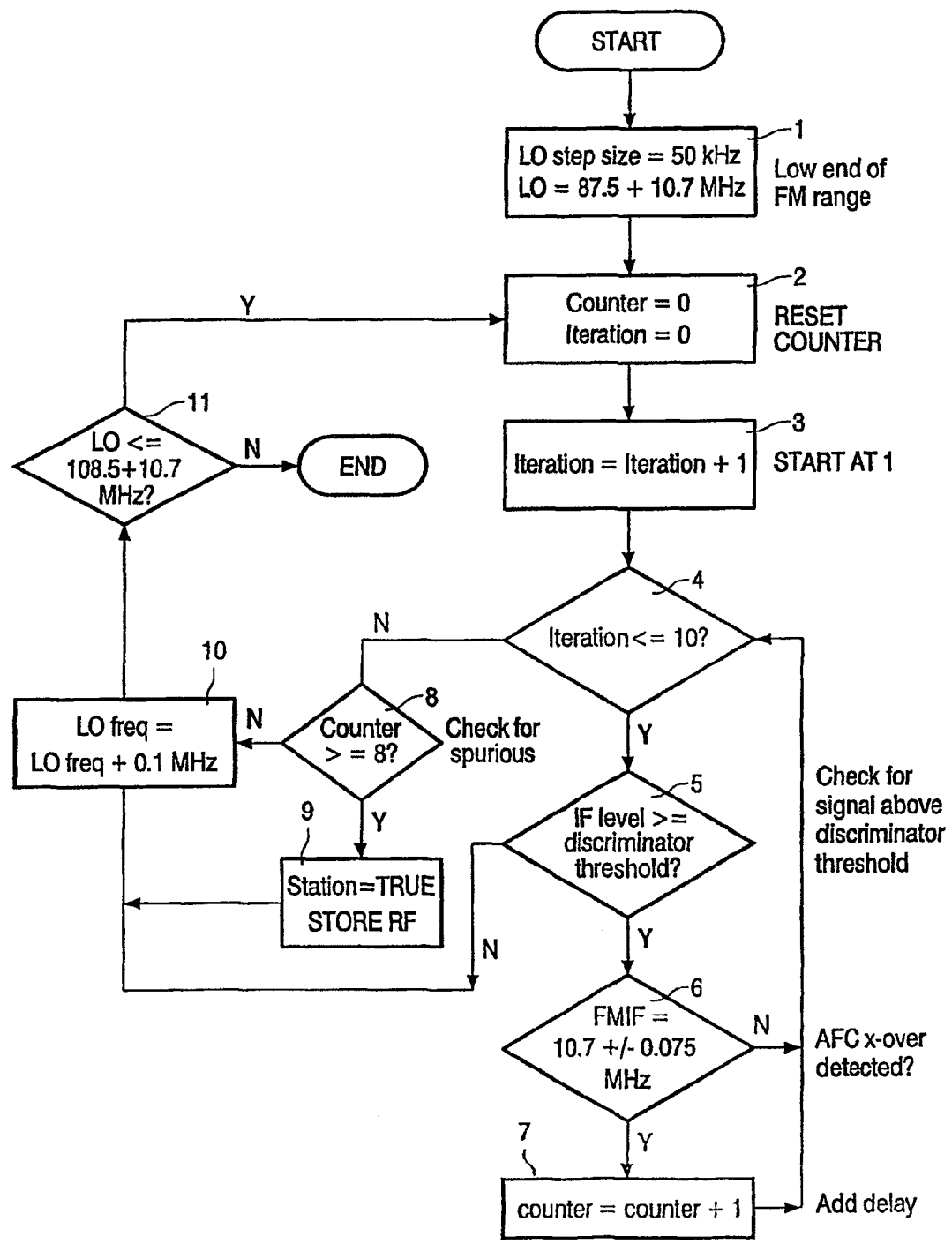

| | | | |
|---|---|---|---|
| 6,131,031 A * | 10/2000 | Lober et al. | 455/444 |
| 6,263,196 B1 * | 7/2001 | Miyashita | 455/161.1 |
| 6,782,239 B2 * | 8/2004 | Johnson et al. | 455/42 |
| 6,957,053 B1 * | 10/2005 | Moers | 455/186.1 |
| 7,072,686 B1 * | 7/2006 | Schrager | 455/556.1 |
| 7,174,186 B2 * | 2/2007 | Onodera | 455/525 |
| 7,190,937 B1 * | 3/2007 | Sullivan et al. | 455/130 |
| 7,395,043 B2 * | 7/2008 | Atsumi | 455/226.2 |
| 7,447,488 B2 * | 11/2008 | Howard et al. | 455/179.1 |
| 2005/0091271 A1 * | 4/2005 | Srinivas et al. | 707/104.1 |
| 2006/0128308 A1 * | 6/2006 | Michael et al. | 455/41.2 |
| 2007/0010221 A1 * | 1/2007 | Howard et al. | 455/179.1 |

FOREIGN PATENT DOCUMENTS

| | | |
|---|---|---|
| EP | 0430469 A3 | 6/1991 |
| EP | 0430469 B1 | 6/1991 |

* cited by examiner

METHOD AND APPARATUS FOR AUTO-TUNING OF A RADIO FM-RECEIVER

This patent document claims benefit to International Application No. PCT/IB03/02427, filed on Jun. 4, 2003, which is fully incorporated herein by reference.

The invention relates to a method of auto-tuning a radio FM-receiver by scanning the receiver frequency band until a FM signal is received meeting critera for identifying the signal as being of a predetermined quality, particularly coming from a valid FM station.

One of the essential features in a broadcast receiver is the auto-tune function This enables a user to scan the receiver frequency band for available signals, tune them in and store them in presets, all at the press of a button. Particularly in TV-FM radio combi receivers TV and FM radio frequency signals are converted to baseband video and audio signals by means of such an auto-tune function. This auto-tune function is important, for example, for PC (personal computer) TV card makers who want to provide computer users with the possibility to enjoy broadcast TV and radio while working on their PC's.

The concept of auto-tuning for TV is well established and relatively error free, in that a TV signal is a unique type of modulated signal, which amongst other characteristics has a periodic synchronization pulse. With this it is always possible to discriminate between a TV signal and a non-TV signal, including short duration, non-periodic noise.

However, a relatively error free auto-tuning is not well possible in the case of FM radio. A FM discriminator is not inherently able to differentiate between a real FM radio signal and an interfering non-FM signal, which can be frequency stable or random. This results in a case where well known auto-tune systems may capture numerous signals and store them, but perhaps only a small part of them are intended signals. Tuning to the rest of the presets will give just irritating noise.

The first problem lies in the sensitivity of the receiver system, which is able to detect signals that are close to the noise floor. This means that the chance of mistakenly storing a random noise signal that exists at the moment of auto-tune is relatively high. In addition, it also means that a true FM signal that is very weak might also be captured. In reality once a FM radio signal falls below certain signal strength, commonly known as the FM threshold, it makes little sense to store a channel since the sound quality is simply too poor to be intelligible.

It is known to apply two conditions that need to be fulfilled when deciding if a signal is a valid FM station. The level of FM-IF signal must be sufficiently high. This can done, for example, by setting a bit in a status register, which is available to the user. This criterion is indicated in the following as "intensity". When this condition is met, the AFC (automatic frequency control) status must be checked; if the received signal is within the IF bandwidth, the second condition is met and the signal is then stored as a valid station. For the 10.7 MHz IF band, the received signals must be within ±75 kHz of the 10.7 MHz IF. This second criterion is indicated in the following as "AFC window" A concept of auto-tuning a radio FM-receiver by scanning the receiver frequency band until an FM signal is received meeting the above criteria for identifying the signal of a predetermined I quality, is already known, for example from the European patent application EP-A-0 430 469. When a received FM signal meets both criteria, this is indicated in the following as I "a positive check result".

However, in case that a sufficiently strong random interference reaches the demodulator of the radio FM-receiver, it too may be stored mistakenly as it can momentarily appear within the AFC window.

The purpose of the invention is to prevent capture of such frequency random interferences.

Therefore, according to the invention, the method as described in the opening paragraph is characterized in that at least during tuning it is permanently established whether or nor the FM signal meets the criteria, whereafter the results thereof are read a predetermined number of times, and the FM signal is only stored if at least most of the times the criteria are met. It has been found that good results are obtained when these results are read 10 times and the FM signal is only stored if at least 8 times thereof the criteria are met.

The invention further relates to an auto tuning device with means to register whether or not a FM signal, received in a radio FM receiver, meets criteria for identifying the signal as being of a predetermined quality, particularly coming from a valid FM station, and counting means to register in an interval of a predetermined number of times that is registered whether or not the FM signal meets the criteria, the number of times the FM signal meets the criteria. The invention also relates to a radio FM-receiver for realizing the above method, comprising the above auto-tuning device.

The invention further relates to an algorithm for processing FM signals in an auto tuning device according to the above, to a computer program capable of running on signal processing means in a radio FM receiver or cooperating with a radio FM receiver comprising the above auto tuning device, and to an information carrier, carrying instructions to be executed by signal processing means, the instructions being such as to enable said processing means to perform the above method.

The invention will further be clarified by a specific embodiment and with reference to the drawing, in which:

FIG. 1 shows a flow diagram of the method according to the invention.

The scanning of the FM band, this is in most of the world the frequency range from 87.5 to 108.5 MHz, is performed by means of a local oscillator (LO) signal which is swept in a range from 98.2 to 119.2 MHz in steps of 50 kHz. In the flow-diagram this is indicated by block 1. At the beginning of each LO sweep a counter for counting positive check results is reset. As soon as a FM signal is received, it is checked whether or not this signal meets the signal quality criteria "intensity" and "AFC window". This is done in 10 iteration steps. When the counter is reset, the number of iterations is reset too. The iteration procedure is started by 1 (block 3), while each time the received FM signal is checked, the number of iterations is raised by 1. The number of iterations in this example is limited to 10. As long as the number of iterations has not reached the value of 10, indicated in block 4, it is checked whether or not the FM signal meets the criteria "intensity" (block 5) and "AFC window" (block 6). When the FM signal meets both criteria, the counter for positive check results is raised by 1 (block 7) and, after a short delay, a following check of the FM signal is performed (block 4). When, after 10 iteration steps (block 4), in this example 8 times a positive check has been registered (block 8), the found FM signal is coming from a real station and the corresponding radio frequency thereof is stored (block 9). When 10 iteration steps are performed and there are no 8 positive results (blocks 4 and 8), the LO frequency value is raised by two steps, this is by 100 kHz (block 10). When the end of the LO frequency sweep is not yet reached (block 11), the counter is reset again and a search to a valid FM station is started on a shifted frequency. When the end of the LO frequency sweep is reached, the procedure ends and can be started again. When the first criterion "intensity" is not met (block 5), the local oscillator signal is raised, whereafter the procedure is repeated or ended as described. When the first criterion "intensity" is met, but the second criterion "AFC window" not, the number of iteration steps is raised but, of course, not the number of positive results. Nevertheless, thereafter, a positive check result can be obtained, as it is still possible that 8 positive check results in 10 iteration steps are obtained.

This procedure is performed in an auto tuning device, being part of a radio FM receiver, with means to register whether or not a FM signal, received in a radio FM receiver, meets the criteria "intensity" and "AFC window". Whether or not the FM signal meets the critera can permanently, or at least during tuning, be registered in the auto tuning device, for example in a status register therein. This status register will be read 10 times during each checking procedure. Therefore, the tuning device will comprise counting means to register in an interval of a predetermined number of times (10 times) that is registered whether or not the FM signal meets the criteria, the number of times the FM signal meets the criteria.

The above checking procedure will be performed by means of an algorithm in the form of a computer program capable of running on signal processing means in the radio FM receiver or cooperating with the radio FM receiver comprising the auto tuning device.

The invention is not restricted to the described embodiment. Modifications are possible. Particularly the number of iteration steps and the number of positive checking results within the number of iteration steps may be chosen differently from 10 and 8, respectively. Further, it can be noticed that the scanning procedure as described above can be applied for of a FM band in the frequency range from about 75 MHz to 91 Mhz, as is the case in Japan.

The invention claimed is:

1. Method of auto-tuning a radio FM-receiver having a receiver frequency band, the method comprising:

scanning the receiver frequency band until a FM signal is received that has a signal strength greater than a FM threshold and that is in an automatic frequency control (AFC) window associated with a valid FM station;

immediately after receiving said FM signal, testing whether the FM signal meets criteria, including
checking whether the signal strength of the FM signal is greater than the FM threshold,
when the signal strength of the FM signal is greater than the FM threshold, checking whether the FM signal is in the AFC window, and
incrementing a count when the FM signal is in the AFC window;

repeating the testing step a predetermined number of times; and storing information denoting a frequency of the FM signal when the count indicates that both of the criteria are met a majority of the predetermined number of times.

2. Method as claimed in claim 1, wherein the predetermined number of times is 10 and the information denoting the frequency of the FM signal is stored when the count is at least 8.

3. The method of claim 1, wherein scanning the receiver frequency band includes scanning a frequency range from 87.5 to 108.5 MHz.

4. The method of claim 1, wherein scanning the receiver frequency band includes sweeping a local oscillator (LO) signal in a range from 98.2 to 119.2 MHz in steps of 50 kHz.

5. The method of claim 4, further comprising performing the testing step the predetermined number of times for each LO sweep and, at the beginning of each LO sweep, resetting the count to zero.

6. The method of claim 5, wherein the predetermined number of times is 10 and, for each LO sweep, storing information denoting the frequency of the FM signal when the count is at least 8.

* * * * *